US010090223B2

(12) United States Patent
Momose et al.

(10) Patent No.: US 10,090,223 B2
(45) Date of Patent: Oct. 2, 2018

(54) SEMICONDUCTOR DEVICE AND METHOD OF MANUFACTURING SAME

(71) Applicant: Fuji Electric Co., Ltd., Kanagawa (JP)

(72) Inventors: Fumihiko Momose, Nagano (JP); Hiroyuki Nogawa, Nagano (JP); Yoshitaka Nishimura, Nagano (JP); Eiji Mochizuki, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/453,032

(22) Filed: Mar. 8, 2017

(65) Prior Publication Data
US 2017/0317008 A1 Nov. 2, 2017

(30) Foreign Application Priority Data

Apr. 27, 2016 (JP) .................. 2016-089818

(51) Int. Cl.
*H01L 23/373* (2006.01)
*H01L 23/00* (2006.01)

(52) U.S. Cl.
CPC .......... *H01L 23/3735* (2013.01); *H01L 24/48* (2013.01); *H01L 24/85* (2013.01); *H01L 2224/48225* (2013.01); *H01L 2224/85205* (2013.01)

(58) Field of Classification Search
CPC ..... H01L 23/3735; H01L 24/48; H01L 24/85; H01L 2224/48225; H01L 2224/85205
See application file for complete search history.

(56) References Cited

U.S. PATENT DOCUMENTS

| | | | | |
|---|---|---|---|---|
| 6,638,592 B1 * | 10/2003 | Schulz-Harder | ...... | H01L 21/481 257/E23.07 |
| 7,446,406 B2 * | 11/2008 | Mizuno | ............... | H01L 23/5385 257/678 |
| 8,395,262 B2 * | 3/2013 | Momose | ................ | H01L 24/80 257/741 |
| 2010/0065962 A1 * | 3/2010 | Bayerer | .............. | H01L 23/3735 257/703 |
| 2013/0084679 A1 * | 4/2013 | Stolze | .................... | H01L 24/83 438/121 |

(Continued)

FOREIGN PATENT DOCUMENTS

JP H8-146451 A 6/1996
JP H11-177007 A 7/1999
(Continued)

*Primary Examiner* — Peniel M Gumedzoe
(74) *Attorney, Agent, or Firm* — Chen Yoshimura LLP (57) ABSTRACT

A semiconductor device includes a heat-dissipating base, a first conductive layer bonded to the top surface of the heat-dissipating base, an AlN insulating substrate bonded to the top surface of the first conductive layer, and an electrode terminal having one edge bending to form a bonding edge whose bottom surface faces the top surface of the second conductive layer and is solid-state bonded to a portion of the top surface of the second conductive layer. The crystal grain diameter at the bonded interface of the second conductive layer and electrode terminal is less than or equal to 1 μm, and indentations from the ultrasonic horn are left in the top surface of the bonding edge.

8 Claims, 9 Drawing Sheets

(56) References Cited

U.S. PATENT DOCUMENTS

2014/0370663 A1* 12/2014 Bayerer .................. H01L 21/52
                                                      438/125
2015/0303166 A1* 10/2015 Momose ................ H01L 24/78
                                                      228/110.1
2015/0380368 A1* 12/2015 Momose ................ H01L 24/43
                                                      257/741

FOREIGN PATENT DOCUMENTS

| JP | 2000-232332 A | 8/2000 |
|----|---------------|--------|
| JP | 2009-28729 A  | 2/2009 |
| JP | 2010-21216 A  | 1/2010 |
| JP | 2011-20177 A  | 2/2011 |
| JP | 2015-56412 A  | 3/2015 |
| JP | 2015-69982 A  | 4/2015 |
| WO | 2011/092809 A1| 8/2011 |

* cited by examiner

SEMICONDUCTOR DEVICE AND METHOD OF MANUFACTURING SAME

BACKGROUND OF THE INVENTION

Technical Field

The present invention relates to a semiconductor device having an insulating substrate made of aluminum nitride (AlN) and a method of manufacturing the same.

Background Art

An insulated circuit substrate in which conductive layers are bonded to both surfaces of a ceramic insulating substrate is used when mounting power semiconductor devices. Solder, ultrasonic welding, and the like are examples of methods for bonding the conductive layers of the insulated circuit substrate to an electrode terminal for electrically connecting to an external circuit. Ultrasonic welding makes it possible to have a stronger bond than with solder and offers higher reliability.

Conventional ultrasonic welding technology includes Patent Document 1, which discloses ultrasonic welding wiring patterns and leads on an insulating substrate. Patent Document 2 discloses ultrasonic welding electrode terminals to a conductive pattern on an insulating substrate made of AlN with a thickness of 0.635 mm or 0.32 mm. Patent Document 3 discloses bonding chips to a substrate via bonding energy that is a combination of the energy from ultrasonic vibrations and the energy from a pulse heater, and during this the welding temperature is raised to approximately 150° C. Patent Document 4 discloses, when welding chips to the substrate, applying ultrasonic vibrations and setting a welding temperature from the standby temperature of the heater (approx. 50° C.) to approximately 150° C., which is lower than a temperature (approx. 183° C.) below the melting point of a molten metal electrode.

Furthermore, Patent Document 5 discloses heating a ceramic package at a low temperature of approximately 150° C. to 200° C. and applying both pressure and ultrasonic waves during welding of a crystal oscillator onto an Au metallized internal terminal using an Au bump. Patent Document 6 discloses applying ultrasonic waves and heating via light radiation during welding of electrode terminals to wiring patterns. Patent Documents 7 to 9 each disclose combining ultrasonic waves and heating when welding members together.

As described in Patent Document 1, Patent Document 2, etc., the material of the ceramic insulating substrate is AlN, alumina ($Al_2O_3$), or silicon nitride ($Si_3N_4$). Among these, AlN has excellent thermal conductivity compared to $Al_2O_3$ or $Si_3N_4$, but has a weaker mechanical strength than an insulating substrate made of $Al_2O_3$ or $Si_3N_4$. Therefore, as described in Patent Document 1, Patent Document 2, etc., when welding electrode terminals to an AlN insulating substrate via ultrasonic welding, the insulating substrate is susceptible to cracking, thus leading to insulation defects, and cannot be mass produced.

RELATED ART DOCUMENTS

Patent Documents

Patent Document 1: Japanese Patent Application Laid-Open Publication No. 2015-69982
Patent Document 2: Japanese Patent Application Laid-Open Publication No. 2015-56412
Patent Document 3: Japanese Patent Application Laid-Open Publication No. 2011-20177
Patent Document 4: Japanese Patent Application Laid-Open Publication No. 2009-28729
Patent Document 5: Japanese Patent Application Laid-Open Publication No. 2000-232332
Patent Document 6: Japanese Patent Application Laid-Open Publication No. H8-146451
Patent Document 7: Japanese Patent Application Laid-Open Publication No. 2010-21216
Patent Document 8: Japanese Patent Application Laid-Open Publication No. H11-77007
Patent Document 9: WO 2011/092809

SUMMARY OF THE INVENTION

In consideration of the problems described above, the present invention aims at providing a semiconductor device that inhibits cracking of an AlN insulating substrate and in which the insulating substrate and electrode terminals are strongly bonded together, and a method of manufacturing this semiconductor device. Accordingly, the present invention is directed to a scheme that substantially obviates one or more of the problems due to limitations and disadvantages of the related art.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor device, including: a heat-dissipating base; a first conductive layer bonded to a top surface of the heat-dissipating base; an insulating substrate made of aluminum nitride bonded to a top surface of the first conductive layer; a second conductive layer bonded to a top surface of the insulating substrate; and an electrode terminal having a bonding edge formed by bending an edge of the electrode terminal, the bonding edge being bonded via solid-state flow to a portion of a top surface of the second conductive layer, wherein a crystal grain diameter at a bonded interface of the second conductive layer and the electrode terminal is less than or equal to 1 μm, and indentations of an ultrasonic horn remain in a top surface of the bonding edge.

In another aspect, the present disclosure provides a method of manufacturing a semiconductor device, including: preparing an insulated circuit substrate having a first conductive layer, an insulating substrate made of aluminum nitride bonded to a top surface of the first conductive layer, and a second conductive layer bonded to a top surface of the insulating substrate; bonding the first conductive layer to a heat-dissipating base; preparing an electrode terminal having a bonding edge formed by bending an edge of the electrode terminal; causing a top surface of the second conductive layer to face a bottom surface of the bonding edge; and bonding, in a heated state within a range of 50° C. to 125° C., a portion of the top surface of the second conductive layer to the bottom surface of the bonding edge by causing a solid-state flow via ultrasonic waves.

The present invention makes it possible to provide a semiconductor device that inhibits cracking of an AlN insulating substrate and in which the insulating substrate and electrode terminal are strongly bonded together, and a method of manufacturing this semiconductor device. It is to be understood that both the foregoing general description and the following detailed description are exemplary and explanatory, and are intended to provide further explanation of the invention as claimed.

DETAILED DESCRIPTION OF EMBODIMENTS

Embodiments of the present invention will be described hereafter with reference to the drawings. In the drawings referenced by the explanations below, portions that are the same or similar will be assigned the same or similar reference characters. However, it should be noted that the drawings are schematic, and that the relation between the thickness and planar dimensions and the ratio of thicknesses of the respective layers differ in practice. Thus, specific thicknesses and dimensions should be determined based on the description below. Furthermore, there are naturally portions that differ in dimensional relations and ratios in their depiction among different drawings.

Moreover, the embodiments below illustratively depict a method of manufacturing a semiconductor device in order to specify the technical concepts of the present invention, and the technical concepts of the present invention are not limited to the materials, shapes, structures, positions, and the like of the constituting components described below. Various modifications can be made to the technical concepts of the present invention within the technical scope defined by the claims.

Furthermore, in the present specification, the definition of "top" and "bottom" such as in "top surface" and "bottom surface" is merely a matter of expression in regard to the portrayed cross-sectional view; for example, if the orientation of the semiconductor device were shifted 90° counterclockwise, "top" and "bottom" would be called "left" and "right", and if shifted 180° the relationship between "top" and "bottom" would be reversed.

(Configuration of Semiconductor Device)

Figure 1A:
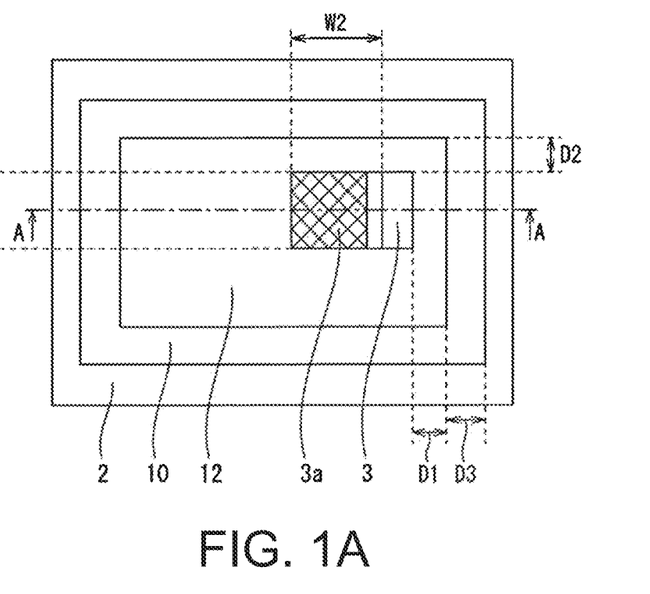
FIG. 1A is a plan view of one example of a semiconductor device according to an embodiment of the present invention.
Figure 1B:
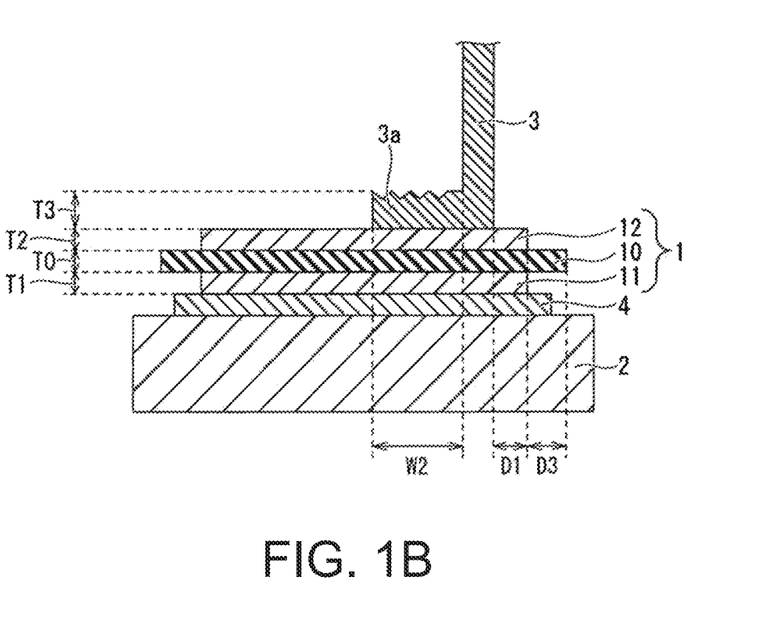
FIG. 1B is a cross-sectional view seen from the A-A direction of FIG. 1A.

As shown in FIGS. 1A and 1B, a semiconductor device of an embodiment of the present invention includes a heat-dissipating base 2, an insulated circuit substrate 1 disposed on a top surface of the heat-dissipating base 2, and an electrode terminal 3 disposed on a top surface of the insulated circuit substrate 1. Although not shown, a plurality of power semiconductor devices are mounted on the insulated circuit substrate 1, and these devices form at least a portion of single power semiconductor device units such as IGBTs or MOSFETs or circuits such as inverters or converters.

The heat-dissipating base 2 dissipates heat from the insulated circuit substrate 1. The material of the heat-dissipating base 2 can be copper (Cu), aluminum (Al), or an alloy of these, aluminum silicon carbide (AlSiC), or the like, for example. The heat-dissipating base 2 and insulated circuit substrate 1 are bonded together by a bonding member (solder layer) 4. The material of the bonding member 4 can be tin (Sn), lead (Pb), silver (Ag), copper (Cu), or an alloy of these, for example.

The insulated circuit substrate 1 includes a first conductive layer 11 bonded to the top surface of the heat-dissipating base 2 by the bonding member 4, an AlN insulating substrate 10 bonded to the top surface of the first conductive layer 11, and a second conductive pattern (circuit pattern layer) 12 bonded to the top surface of the insulating substrate 10. The insulating substrate 10 and the second conductive layer 12, and the insulating substrate 10 and the first conductive layer 11 are respectively bonded to each other by silver solder (not shown), for example.

The insulating substrate 10 has a rectangular planar pattern, for example, and a size of e.g. 39 mm×53 mm. A thickness T0 of the insulating substrate 10 is approximately 0.2 mm to 1.0 mm, for example, and is preferably approximately 0.2 mm to 0.635 mm, or alternatively may be 0.38 mm, for example. Table 1 shows thermal conductivity, strength, linear thermal expansion coefficient (CTE), and relative thickness for AlN, $Al_2O_3$, and $Si_3N_4$. In table 1, "strength" means bending strength, and "relative thickness" means a relative value of thickness ordinarily required when used as an insulating substrate. From table 1 it can be understood that AlN has significantly better thermal conductivity than $Al_2O_3$ or $Si_3N_4$, but is mechanically weaker and susceptible to cracking.

TABLE 1

| Material | Thermal Conductivity (W/mK) | Strength (MPa) | CTE ($\times 10^{-8}$/K) | Relative Thickness (a.u.) |
|---|---|---|---|---|
| $Al_2O_3$ | 20 | 500 | 7.0 | 1.0 |
| $Si_3N_4$ | 80 | 700 | 3.4 | 1.0 |
| AlN | 170 | 450 | 4.6 | 2.0 |

The individual sizes of the first conductive layer 11 and second conductive layer 12 can be set smaller than the size of the insulating substrate 10. The thickness T1 of the first conductive layer 11 and thickness T2 of the second conductive layer 12 can each be set to approximately 0.2 mm to 1.0 mm. The thickness T1 of the first conductive layer 11 and the thickness T2 of the second conductive layer 12 may be the same or different. The material of the first conductive layer 11 and second conductive layer 12 can be Cu or Al, for example. The first conductive layer 11 and second conductive layer 12 may be the same material as each other or mutually differing materials.

The material of the electrode terminal 3 can be Cu, Al, or the like, and it is possible to use C1020-1/2H (JIS standards), for example. As shown in FIG. 1B, one edge of the electrode terminal 3 is an "L" shape that bends at approximately a right angle, and the portion bending in the "L" shape that is generally parallel to the top surface of the second conductive layer 12 constitutes a bonding edge 3a that is bonded to the second conductive layer 12. The bottom surface of the bonding edge 3a of the electrode terminal 3 and a portion of the top surface of the second conductive layer 12 are bonded together by solid-state bonded via ultrasonic welding in a heated state.

Ultrasonic welding is one type of solid-state bonding. Solid-state bonding generally creates stronger bonded sections than fusion welding, and unlike brazing can weld identical materials together. Ultrasonic welding of metal exerts horizontal ultrasonic vibration and vertical pressure to the bonded interface to remove the oxide film or the like at the interface and generate frictional heat on the resulting metal surface, thereby causing a solid-state motion in order to create a bond.

A thickness T3 of the bonding edge 3a of the electrode terminal 3 is approximately 0.2 mm to 2.0 mm, for example. The other edge of the electrode terminal 3 is electrically connected to an external circuit or the like (not shown). As schematically shown in FIGS. 1A and 1B, indentations from the ultrasonic horn during ultrasonic welding are left in the top surface of the bonding edge 3a of the electrode terminal 3. The shape of the indentations from the ultrasonic horn depend on the shape of the ultrasonic horn and are not particularly limited to the shapes illustratively shown in FIGS. 1A and 1B. For example, in FIG. 1A the indentations have a grid-shaped planar pattern as an example, but may alternatively be a concentric planar pattern.

As shown in FIG. 1A, the bonding edge 3a of the electrode terminal 3 is rectangular on the planar pattern, for example. A width W1 of the bonding edge 3a in the direction along the left-right direction of the sheet surface of FIG. 1A and a width W2 of the bonding edge 3a in the direction perpendicular to the width W1 are each approximately 1.0 mm to 4.0 mm, for example. The widths W1 and W2 may be the same or different.

Figure 2:
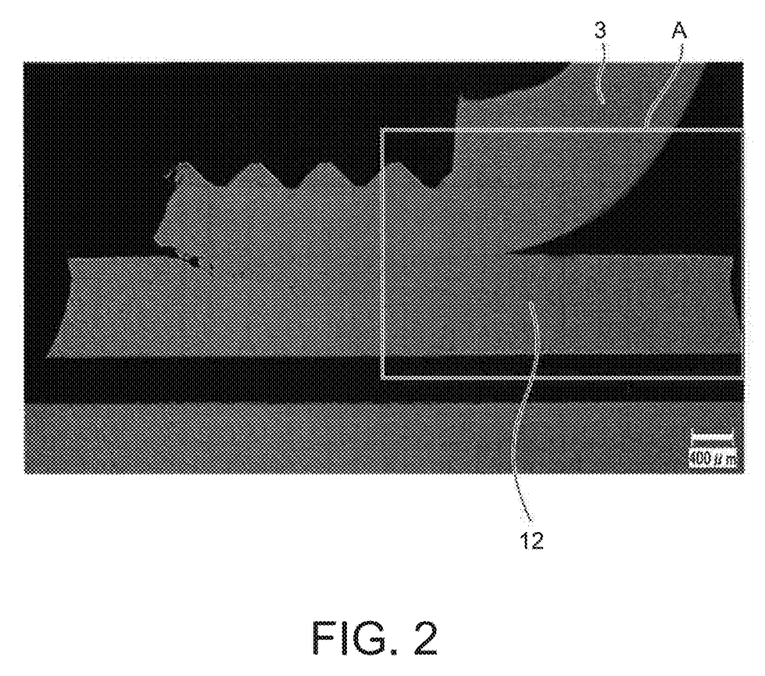
FIG. 2 is a cross-sectional SEM image of primary components of the semiconductor device according to an embodiment of the present invention.
Figure 3:
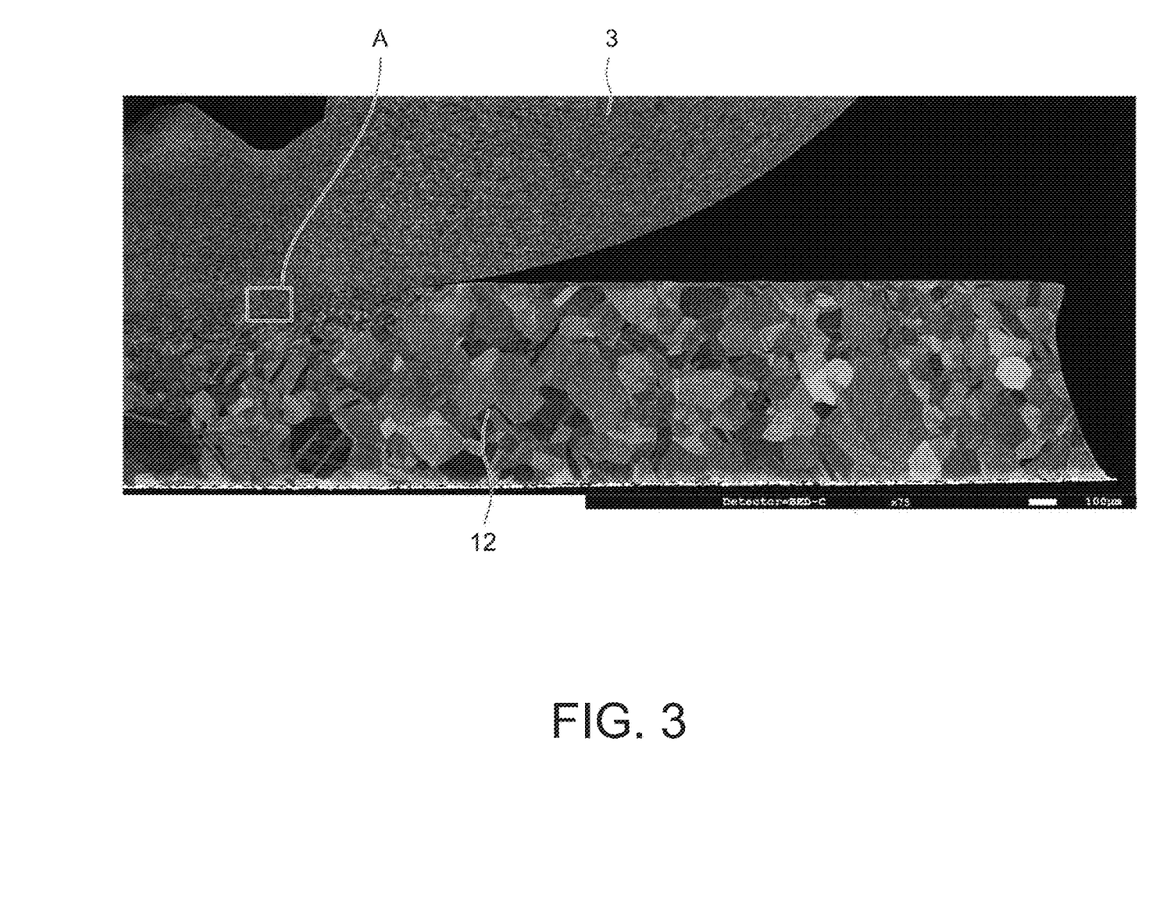
FIG. 3 is a cross-sectional SEM image in which region A in FIG. 2 has been enlarged.
Figure 4:
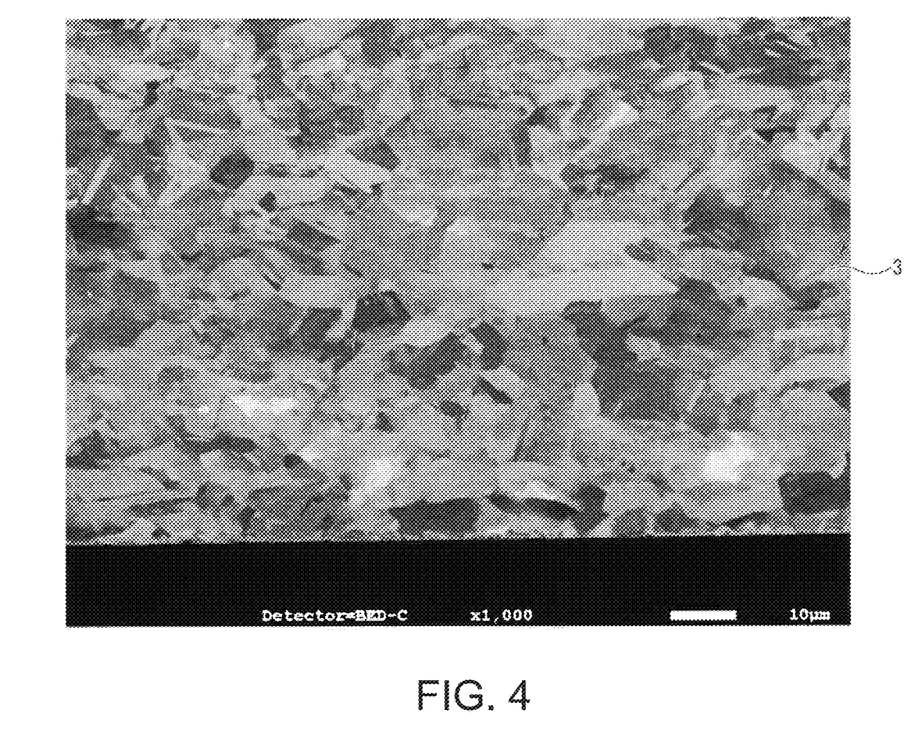
FIG. 4 is a cross-sectional SEM image of an electrode terminal unit of the semiconductor device according to an embodiment of the present invention.
Figure 5:
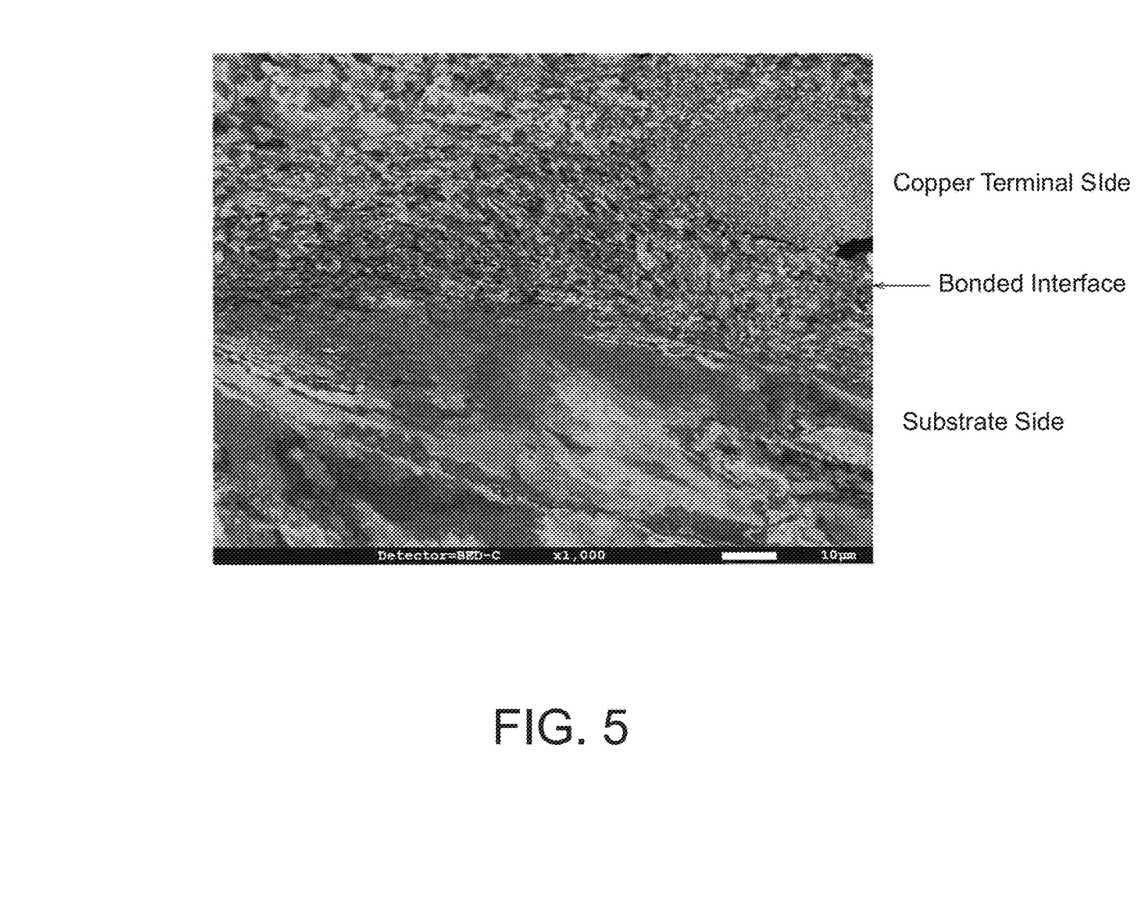
FIG. 5 is a cross-sectional SEM image in which region A in FIG. 3 has been enlarged.

FIG. 2 shows a cross-sectional SEM image of the bonded interface between the electrode terminal 3 and the second conductive layer 12 when the electrode terminal 3 and second conductive layer 12 of the semiconductor device according to an embodiment of the present invention are made of Cu. FIG. 3 shows a cross-sectional SEM image in which the region A in FIG. 2 has been expanded. FIG. 4 is a cross-sectional SEM image of the electrode terminal 3 unit before ultrasonic welding. FIG. 5 is a cross-sectional SEM image in which the region A in FIG. 3 has been expanded.

As shown in FIG. 3, the crystal grain diameter of the second conductive layer 12 before ultrasonic welding is approximately 40 μm to 300 μm. As shown in FIG. 4, the crystal grain diameter of the electrode terminal 3 unit before ultrasonic welding is approximately 5 μm to 20 μm. In contrast, as shown in FIG. 5, at the bonded interface after ultrasonic welding of the second conductive layer 12 and electrode terminal 3, the crystal grain diameter of the Cu miniaturizes to approximately 0 μm to 1 μm. In the present specification, "crystal grain diameter" means the grain diameter directly measured from the cross-sectional SEM image. The thickness of the bonding layer between the second conductive layer 12 and the electrode terminal 3 in which the grain diameter of the Cu is less than or equal to approximately 1 μm is around 100 μm, for example.

A distance D3 between an edge of the second conductive layer 12 and an edge of the insulating substrate 10 is approximately 0.8 mm, for example, and is constant across the entire periphery of the second conductive pattern 12 on the planar pattern. It is preferable that a distance D1 between the electrode terminal 3 in the direction along the left-right direction of the sheet surface of FIG. 1A and the edge of the second conductive layer 12 be offset by at least approximately 0.5 mm. Moreover, it is preferable that a distance D2 between the electrode terminal 3 in the direction perpendicular to the distance D1 and the edge of the second conductive layer 12 be offset by at least approximately 0.5 mm. In other words, it is preferable that the bonding edge 3a of the electrode terminal 3 be offset by at least approximately 0.5 mm from the edge of the second conductive layer 12 across the entire periphery of the second conductive layer 12.

When the distance D3 between the edge of the second conductive layer 12 and the edge of the insulating substrate 10 is offset by approximately 0.8 mm, setting the distances D1 and D2 to at least approximately 0.5 mm makes it possible to reduce the tensile stress exerted on the insulating substrate 10 positioned directly below the bonding edge 3a of the electrode 3 and to inhibit insulation breakdown during ultrasonic welding of the electrode terminal 3 and the second conductive layer 12.

The semiconductor device of Embodiment 1 makes it possible to realize a configuration in which a thin AlN insulating substrate 10 is used when firmly bonding the electrode terminal 3 and second conductive layer 12 together in a heated state via ultrasonic welding.

(Method of Manufacturing Semiconductor Device)

Figure 6A:
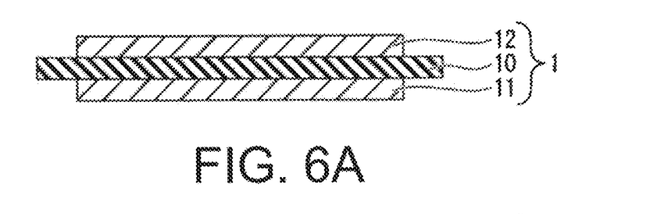
FIGS. 6A to 6C are step cross-sectional views for explaining one example of a method of manufacturing the semiconductor device according to an embodiment of the present invention.
Figure 6B:
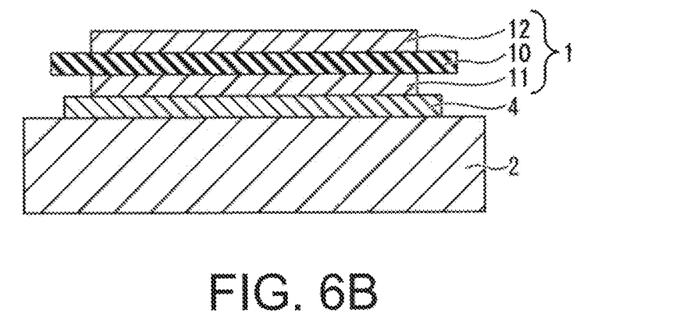
Figure 6C:
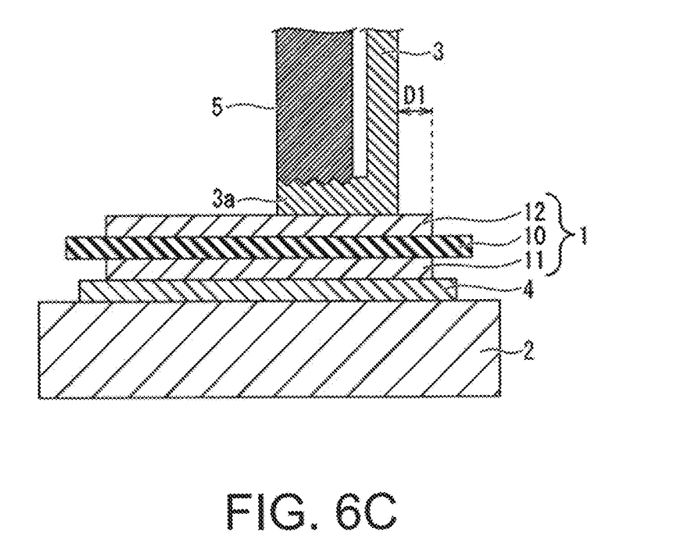

Next, an example of a method of manufacturing the semiconductor device of an embodiment of the present invention will be described with reference to FIGS. 6A to 6C.

First, the AlN insulating substrate 10 is prepared and the second conductive layer 12 and first conductive layer 11 are soldered via silver solder to the top surface and bottom surface of the insulating substrate 10. This results in the insulated circuit substrate 1 shown in FIG. 6A. Then, as shown in FIG. 6B, the first conductive layer 11 of the insulated circuit substrate 1 is bonded to the heat-dissipating base 2 using a bonding member 4 such as solder.

Next, the insulated circuit substrate 1 that has been bonded to the heat-dissipating base 2 is fixed to the anvil of an ultrasonic welding device. Thereafter, in atmospheric conditions a hotplate or the like raises the insulating circuit substrate 1 bonded to the heat-dissipating base 2 to a temperature range of approximately 50° C. to 125° C. The heating temperature of the insulated circuit substrate 1 can be measured using a thermocouple or the like. Raising the temperature in atmospheric conditions forms a metal (e.g., Cu) oxide film contained in the second conductive layer 12 on the top surface of the second conductive layer 12.

Next, the electrode terminal 3 having one edge bending to form the bonding edge 3a is prepared, and the top surface of the second conductive layer 12 and the bottom surface of the bonding edge 3a are made to face each other. As shown in FIG. 6C, an ultrasonic horn 5 is pressed against the electrode terminal 3. Thereafter, at a prescribed heated temperature (approximately 50° C. to 125° C.), ultrasonic welding is used to bond a portion of the top surface of the second conductive layer 12 of the insulated circuit substrate 1 bonded to the heat-dissipating base 2 to the bottom surface of the bonding edge 3a of the electrode terminal 3.

During ultrasonic welding, the ultrasonic horn 5 applies pressure to the electrode terminal 3 toward the second conductive layer 12 while causing a solid-state motion via ultrasonic vibrations in order to bond the second conductive layer 12 to the bonding edge 3a. The parameters of the ultrasonic welding can be set to: bonding pressure 100 N to 500 N; frequency 19 kHz to 21 kHz; bonding time 300 ms to 700 ms; bonding amplitude 50 μm to 100 μm, for example. The oxide film formed on the top surface of the second conductive layer 12 is removed from the entire surface by friction caused by the ultrasonic vibrations. The crystal grain diameter at the bonded interface after ultrasonic welding of the second conductive layer 12 and electrode terminal 3 is less than or equal to 1 μm.

At such time, it is preferable that the second conductive layer 12 and electrode terminal 3 be bonded such that the distances D1 and D2 between the edge of the second conductive layer 12 and the electrode terminal 3 are offset by at least 0.5 mm. This makes it possible to reduce the tensile stress applied to the insulating substrate 10 directly below the bonding edge 3a of the electrode terminal 3 and to inhibit insulation breakdown of the insulating substrate 10.

In addition to the description above, there may also be other steps, such as a step for mounting a semiconductor chip such as an IGBT on the insulated circuit substrate, a step for wire bonding the semiconductor chip to the second conductive layer 12 and wire bonding the semiconductor chip to an electrode terminal electrically connecting to an external circuit, etc. Furthermore, an example was described in which the second conductive layer 12 is bonded to a single electrode terminal 3, but the second conductive layer 12 may alternatively be bonded to two or more electrode terminals via the method described above.

As described above, in the method of manufacturing the semiconductor device of an embodiment of the present invention, the second conductive layer 12 and the electrode terminal 3 are ultrasonic welded together in a heated state, which miniaturizes the crystal grain diameter of metal at the bonded interface of the second conductive layer 12 and electrode terminal 3 and makes it easier to have solid-state motions and easier to bond than if ultrasonic welding were performed at normal temperatures. Accordingly, this can reduce the energy required for ultrasonic welding and thus reduce the bonding force and amplitude of ultrasonic vibrations during ultrasonic welding and shorten the bonding time. Therefore, it is possible to mitigate damage to the insulating substrate 10 caused by ultrasonic welding, which makes it possible to prevent cracking of the insulating substrate 10 and to make mass production possible.

Furthermore, if the heating temperature during ultrasonic welding exceeds 125° C., there is a marked variation in bonding strength. To counter this, the heating temperature during ultrasonic welding is set to be less than or equal to 125° C., which makes it possible to inhibit large increases in variation of bonding strength. Moreover, from a manufacturing standpoint the heating temperature during ultrasonic welding is preferably 75° C. to 100° C.

Instead of raising the temperature and performing ultrasonic welding in atmospheric conditions, the raising of the temperature and ultrasonic welding may alternatively be performed inside a chamber or the like in a nitrogen ($N_2$) atmosphere or a hydrogen ($H_2$) atmosphere. However, this complicates the device configuration more than performing the raising of the temperature and ultrasonic welding in atmospheric conditions.

Working Example 1

Figure 7:
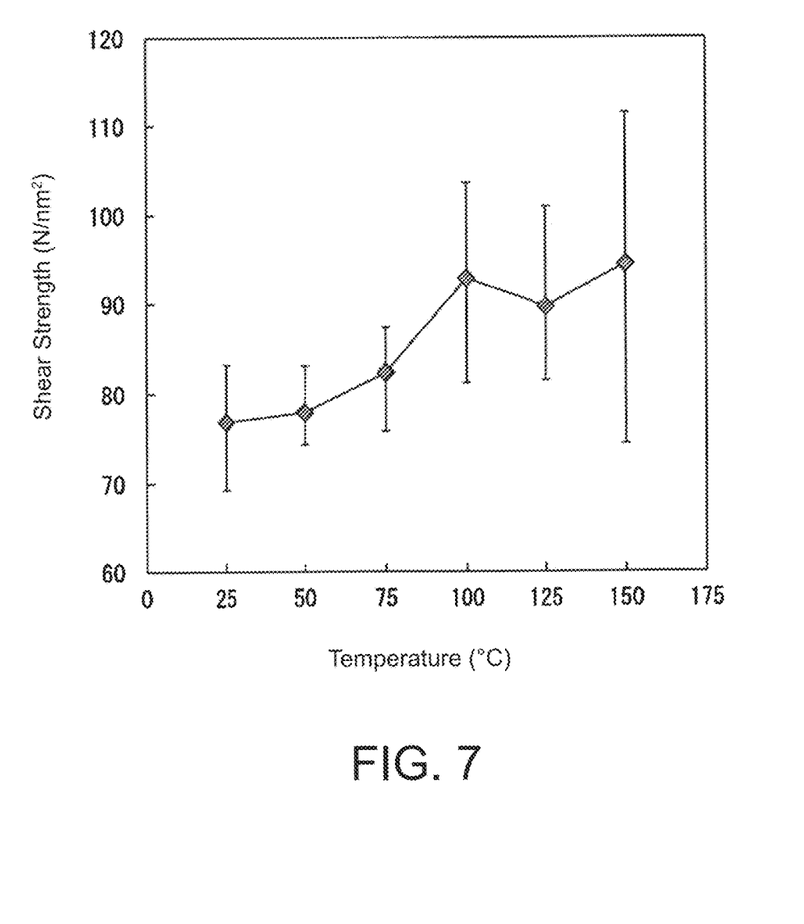
FIG. 7 is a graph showing the relationship between shear strength of a bonded section of an electrode terminal and second conductive layer and heating temperature in the semiconductor device according to an embodiment of the present invention.

For Working Example 1, specimens were fabricated by ultrasonic welding the second conductive layer 12 and electrode terminal 3 at heated temperatures of 50° C., 75° C., 100° C., and 125° C. For a comparison example, specimens were fabricated by ultrasonic welding with no heat treatment (25° C.) and ultrasonic welding at a heated temperature of 150° C. For each specimen, shear strength was measured at a plurality of locations. These measurement results are shown in FIG. 7. From FIG. 7 it can be interpreted that there is a tendency for shear strength to increase as heating temperature increases, but it can be seen that there is a rapid jump in variation in shear strength for the specimen heated at 150° C. Accordingly, if heating is performed at less than or equal to 125° C., it is possible to inhibit large increases in variation in bonding strength.

Working Example 2

For Working Example 2, specimens were fabricated by ultrasonic welding the second conductive layer 12 and electrode terminal 3 at heated temperatures of 100° C. and 125° C. For a comparison example, specimens were fabricated by ultrasonic welding with no heat treatment (25° C.) and ultrasonic welding at a heated temperature of 150° C. An oxygen (O) depth direction profile was measured using energy-dispersive X-ray spectroscopy (EDX) for these specimens after raising of the temperature and before ultrasonic welding. In the measured depth direction profile, calculation of oxide film thickness was performed with the point (time) where the amount of change in O detection reached ½ defined as the interface between the oxide film and Cu and using the etching rate of the Cu (10.923 nm/min with $SiO_2$ conversion).

Figure 8:
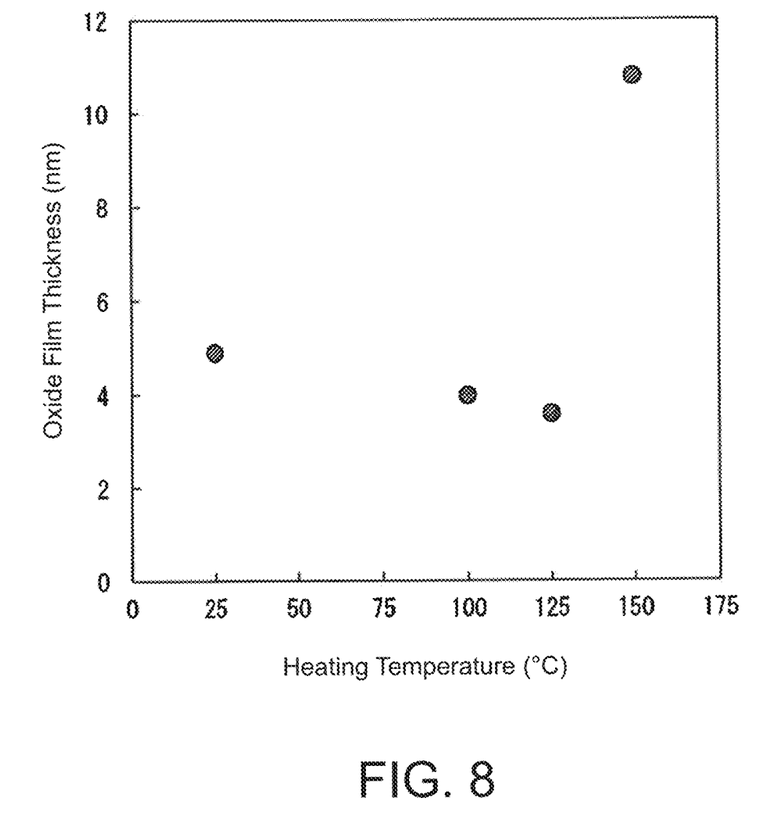
FIG. 8 is a graph showing the relationship between film thickness of an oxide film formed on the surface of the second conductive layer and heating temperature in a manufacturing process of the semiconductor device according to an embodiment of the present invention.

This calculated oxide film thickness is shown FIG. 8. From FIG. 8 it can be understood that the specimens with no heat treatment (25° C.) or 100° C. & 125° C. had an oxide film thickness of approximately 6 nm or below, whereas the 150° C. specimen had an oxide film thickness of approximately 11 nm, or in other words a rapid increase in thickness. It is possible that the large increase in variation in bonding strength shown in FIG. 7 occurs because of this rapid change in oxide film thickness.

Working Example 3

For Working Example 3, specimens were fabricated with the distance D3 between the edge of the second conductive layer 12 and the edge of the insulating substrate 10 at a common 0.8 mm, the distance D1 between the second conductive layer 12 and the electrode terminal 3 differing at 0.5 mm and 1.0 mm, with the second conductive layer 12 and electrode terminal 3 being ultrasonic welded in a heated state of 75° C. As a comparison example, a specimen having a distance D1 between the second conductive layer 12 and electrode terminal 3 of 0 mm and 0.2 mm was fabricated. For each sample, it was measured whether insulation breakdown of the insulating substrate 10 directly below the electrode terminal 3 had occurred.

TABLE 2

| | Electrode Terminal - Circuit Pattern Edge Distance | | | |
|---|---|---|---|---|
| | 0 mm | 0.2 mm | 0.5 mm | 1.0 mm |
| Insulation Breakdown | X | X | ○ | ○ |

These measurement results are shown in Table 2. The "x" on the bottom of Table 2 indicates that insulation breakdown of the insulating substrate 10 has occurred, whereas "o" indicates that insulation breakdown has not occurred. From Table 2 it can be understood that when the distance D1 between the second conductive layer 12 and the electrode terminal 3 is at least 0.5 mm, it is possible to prevent insulation breakdown of the insulating substrate 10.

Other Embodiments

Embodiments of the invention were disclosed above, but the description and drawings constituting a portion of the disclosure are merely examples, and do not limit the invention. Various substitute embodiments, examples, and applied techniques should be clear to a person skilled in the art based on this disclosure.

Figure 9:
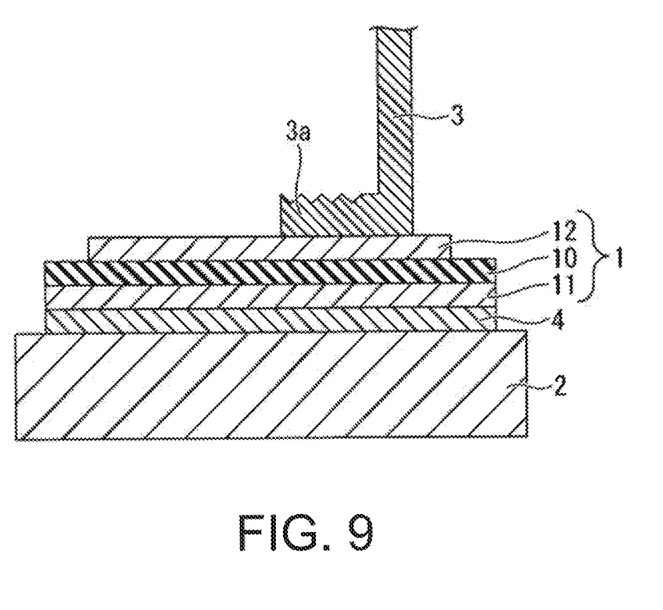
FIG. 9 is a cross-sectional view of one example of a semiconductor device according to another embodiment of the present invention.

For example, as shown in FIG. 9, the first conductive layer 11 on the bottom of the insulating substrate 10 of the insulated circuit substrate 1 may be disposed so as to cover the entire bottom surface of the insulating substrate 10. The covering of the entire bottom surface of the insulating substrate 10 by the first conductive layer 11 makes it possible to reduce the tensile stress applied to the insulating substrate 10 and insulation breakdown during ultrasonic welding of the bottom surface of the bonding edge 3a and the top surface of the second conductive layer 12. During manufacturing of the semiconductor device shown in FIG. 9, the insulated circuit substrate 1 should be fabricated such that the first conductive layer covers the entire bottom surface of the insulating substrate 10.

Furthermore, in an embodiment of the present invention, for convenience of explanation the "L" shape of the edge of the electrode terminal 3 was described as bending at a right angle, but the edge is not necessarily limited to an "L" shape as long as the edge of the electrode terminal 3 bends so as to form the bonding edge. Even if the edge of the electrode terminal 3 is an "L" shape or a shape similar to an "L," the angle of the "L" does not strictly need to be a right angle, but can be approximately a right angle instead. Moreover, "L" shape contains cases in which the bent portion is curved.

The bottom surface of the bonding edge 3a was described as being parallel to the top edge of the second conductive layer 12, but these surfaces do not need to be strictly parallel to each other. Configurations are included in which the bottom surface of the bonding edge 3a faces the top surface of the second conductive layer 12, with the bottom surface of the bonding edge a3 being approximately parallel to the top surface of the second conductive layer 12. It is also possible to have a configuration in which the bottom surface of the bonding edge 3a is curved.

In this manner, these configurations can be applied to various types of semiconductor devices and methods of manufacturing these semiconductor devices without departing from the spirit of the present invention as defined by the scope of the claims.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor device, comprising:
   a heat-dissipating base;
   a first conductive layer bonded to a top surface of the heat-dissipating base;
   an insulating substrate made of aluminum nitride bonded to a top surface of the first conductive layer;
   a second conductive layer bonded to a top surface of the insulating substrate; and
   an electrode terminal having a bonding edge formed by bending an edge of the electrode terminal, the bonding edge being bonded via solid-state flow to a portion of a top surface of the second conductive layer,
   wherein a crystal grain diameter at a bonded interface of the second conductive layer and the electrode terminal is less than or equal to 1 μm, and indentations of an ultrasonic horn remain in a top surface of the bonding edge,
   wherein the second conductive layer and the electrode terminal are each made of copper,
   wherein a thickness of the insulating substrate is 0.2 mm to 1.0 mm,
   wherein the second conductive layer is offset from an edge of the insulating substrate by 0.8 mm, and
   wherein the electrode terminal is offset from an edge of the second conductive layer by at least 0.5 mm.

2. The semiconductor device according to claim 1, wherein the first conductive layer covers an entire bottom surface of the insulating substrate.

3. The semiconductor device according to claim 1, wherein a thickness of the second conductive layer is greater than or equal to 0.2 mm and less than or equal to 1.0 mm.

4. The semiconductor device according to claim 1, wherein a thickness of the bonded interface of the second conductive layer and the electrode terminal is 100 μm.

5. A method of manufacturing a semiconductor device, comprising:
   preparing an insulated circuit substrate having a first conductive layer, an insulating substrate made of aluminum nitride bonded to a top surface of the first conductive layer, and a second conductive layer bonded to a top surface of the insulating substrate;
   bonding the first conductive layer to a heat-dissipating base;
   preparing an electrode terminal having a bonding edge formed by bending an edge of the electrode terminal;
   causing a top surface of the second conductive layer to face a bottom surface of the bonding edge; and
   bonding, in a heated state within a range of 50° C. to 125° C., a portion of the second conductive layer to the bottom surface of the bonding edge by causing a solid-state flow via ultrasonic waves,
   wherein the second conductive layer and the electrode terminal are each made of copper,
   wherein the step of bonding the second conductive layer and electrode terminal causes a crystal grain diameter at a bonded interface of the second conductive layer and the electrode terminal to be less than or equal to 1 μm, wherein a thickness of the insulating substrate is 0.2 mm to 1.0 mm, wherein the second conductive layer is offset from an edge of the insulating substrate by 0.8 mm, and wherein the step of bonding the second conductive layer and the bonding edge is performed such that the electrode terminal is offset from an edge of the second conductive layer by at least 0.5 mm.

6. The method according to claim 5, wherein a thickness of the second conductive layer is greater than or equal to 0.2 mm and less than or equal to 1.0 mm.

7. The method according to claim 5, wherein a thickness of the bonded interface of the second conductive layer and the electrode terminal is 100 μm.

8. The method according to claim 5, wherein the heating temperature during ultrasonic welding is 75° C. to 100° C.

* * * * *

UNITED STATES PATENT AND TRADEMARK OFFICE
CERTIFICATE OF CORRECTION

PATENT NO. : 10,090,223 B2
APPLICATION NO. : 15/453032
DATED : October 2, 2018
INVENTOR(S) : Fumihiko Momose et al.

Page 1 of 1

It is certified that error appears in the above-identified patent and that said Letters Patent is hereby corrected as shown below:

In the Specification

Column 6, Line 1, the text "0 μm" should be changed to -- 0.1μm --.

In the Claims

Column 10, Line 58, Claim 5 the text "a portion of the second conductive layer" should be changed to -- a portion of the top surface of the second conductive layer --.

Signed and Sealed this
Twenty-seventh Day of November, 2018

Andrei Iancu
*Director of the United States Patent and Trademark Office*